United States Patent [19]
Barden

[11] Patent Number: 5,455,739
[45] Date of Patent: Oct. 3, 1995

[54] ASSEMBLY FOR TRANSFERRING HEAT FROM HEAT GENERATING COMPONENTS TO A SURROUNDING HOUSING

[75] Inventor: Robert L. Barden, Durham, N.C.

[73] Assignee: Alcatel Network Systems, Inc., Richardson, Tex.

[21] Appl. No.: 223,459

[22] Filed: Apr. 5, 1994

[51] Int. Cl.⁶ ................................................. H05K 7/20
[52] U.S. Cl. ...................... 361/719; 165/80.3; 361/796
[58] Field of Search ................................ 439/59, 62, 64, 439/76, 485; 361/688, 697, 704, 707, 709, 714, 711, 722, 717–719, 796, 798, 802; 165/80.3, 185; 174/16.3, 252; 257/706, 707, 712, 713; 211/41

[56] References Cited

U.S. PATENT DOCUMENTS

| | | | |
|---|---|---|---|
| 3,634,732 | 1/1972 | Finger | 361/704 |
| 4,027,206 | 5/1977 | Lee | 361/384 |
| 4,203,147 | 5/1980 | Gabr | 361/386 |
| 4,441,140 | 4/1984 | Richard | 361/386 |
| 4,498,119 | 2/1985 | Cronin | 361/386 |
| 4,546,407 | 10/1985 | Benemati | 361/386 |
| 5,243,493 | 9/1993 | Jeng | 361/690 |

*Primary Examiner*—Gerald P. Tolin
*Attorney, Agent, or Firm*—Vinson & Elkins

[57] ABSTRACT

An assembly transfers heat from the heat generating components of a circuit board to a surrounding housing. A removable heat transferring member is inserted into the interior of the housing. The removable heat transferring member is thermally coupled to the heat generating components, physically coupled to the circuit board, and thermally coupled to the housing. The coupling between the removable heat transferring member and the housing is such that the member, and thus the heat generating components and circuit board, can be easily removed from and reinserted into the housing. A portion of the housing is configured as a heat sink to dissipate heat.

17 Claims, 5 Drawing Sheets

ASSEMBLY FOR TRANSFERRING HEAT FROM HEAT GENERATING COMPONENTS TO A SURROUNDING HOUSING

This invention relates generally to assemblies for transferring heat from the heat generating components of a circuit board, and is more particularly directed to the transfer of heat from the heat generating components of a circuit board to a housing surrounding the components and the circuit board.

BACKGROUND OF THE INVENTION

The present invention addresses two well-known problems in the electronics industry. The first problem involves the removal of heat from a component which generates enough heat so that a very large heat sink is typically required for adequate heat dissipation. The second problem addresses the need for quick and easy removal of these heat generating components from their surrounding housing for service, testing, or replacement.

Prior solutions have addressed these problems. In some instances, when a heat generating component requires a very large heat sink, the component is thermally coupled to its surrounding housing. This coupling is often performed by attaching a thermal heat transfer pad to or placing an amount of thermal grease on the housing at the point of desired coupling, and then securing the component to the housing with bolts or machine screws. The thermal heat transfer pad or thermal grease eliminates any insulating airspace between the housing and the component, and therefore heat may transfer from the component to the housing.

However, this prior solution does not facilitate the quick and easy removal of the heat generating component from its surrounding housing. Each time a component or the circuit board is removed from the housing, one must remove the bolt or screws attaching the component to the housing. In the constrained space of an electronics assembly housing, this operation is often difficult and time consuming. In addition, if thermal grease is utilized to thermally couple the component to the housing, an amount of grease must be reapplied to the housing each time a component is secured to the housing.

It is therefore an object of the present invention to provide an assembly which allows a heat generating component to utilize a surrounding housing as a heat sink.

It is a further object of the present invention to provide such an assembly which allows the heat generating component and the circuit board to which the component is connected to be easily and quickly removed from the housing.

It is a further object of the present invention to provide such an assembly in which the removal of the heat generating component or the circuit board from the housing does not require any subsequent operation within the housing to re-establish the thermal coupling between the component and the housing.

Still other objects and advantages of the present invention will become apparent to those of ordinary skill in the art having references to the following specification together with its drawings.

SUMMARY OF THE INVENTION

The present invention includes a removable member for transferring heat from the heat generating components of a circuit board to a housing surrounding the components and circuit board. This member is thermally coupled to the heat generating components, physically coupled to the circuit board, and thermally coupled with the surrounding housing. The member includes an apparatus for removable coupling to the housing so that the member, the heat generating components, and the circuit board can be easily removed from the housing as a single unit. When the member is reinserted into the housing, the thermal coupling between the removable member and the housing can be quickly re-established without the necessity of any operation within the interior of the housing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The preferred embodiment of the present invention and its advantages are best understood by referring to FIGS. 1–5 of the drawings, like numerals being used for like and corresponding parts of the various drawings.

Figure 1:
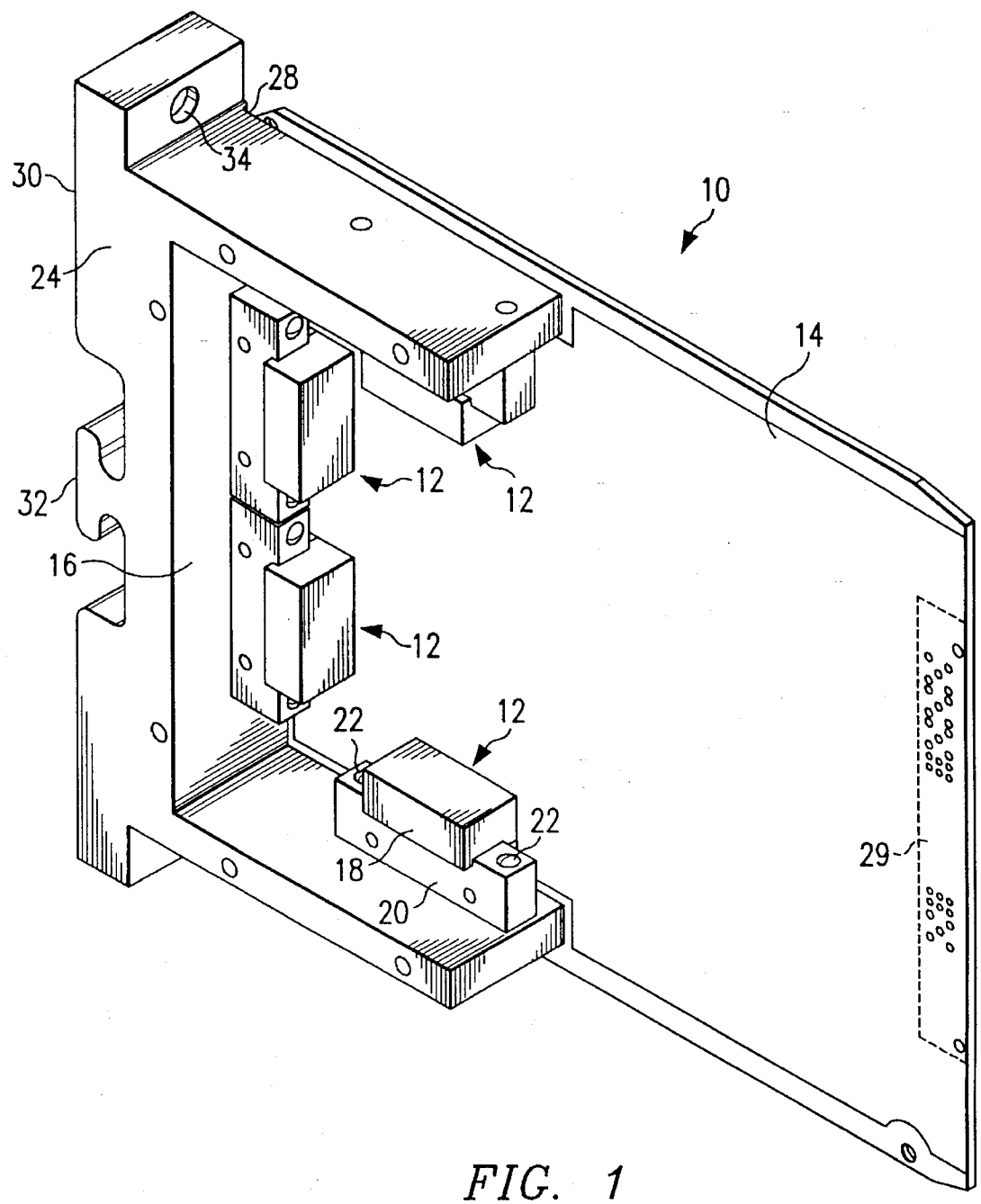
FIG. 1 is a perspective view of the preferred removable heat transferring member of the present invention supporting heat generating components and a circuit board in electrical connectivity to the components.

FIG. 1 illustrates a removable heat transferring member 10 in accordance with the present invention. Removable heat transferring member 10 is preferably integrally formed from a heat conductive material such as aluminum. Removable heat transferring member 10 supports heat generating components 12 and a circuit board 14. Heat generating components 12 are preferably supported by the C-shaped interior surface 16 of removable heat transferring member 10.

Heat generating components 12 are depicted in FIG. 1 as video hybrid amplifiers, but removable heat transferring member 10 is operable to dissipate heat from many heat generating components of a circuit board, such as transistors, resistors, and capacitors. Moreover, while four heat generating components 12 are shown, one should understand that such number is by way of example, and, thus, any number of like components could be employed in the present invention. The video hybrid amplifiers illustrated are standard, potted electronic components purchased from a vendor and are composed of an electronically operative component 18 and a component heat sink 20. Electronically operative component 18 and component heat sink 20 are thermally and physically coupled, preferably through the use of an epoxy. As used in this application, the terms "thermal coupling" or "thermally coupled" mean the coupling of two or more heat conductive surfaces to minimize or eliminate any insulating airspace between the surfaces. Component heat sink 20 has two component coupling holes 22 on either side of electronically operative component 18. One should note that many types of heat generating components 12 do not require component heat sink 20, and whether or not component heat sink 20 is required is preferably a function of the amount of heat which must be dissipated from the particular type of heat generating component 12 employed in the present invention. Removable heat transferring member 10 is operable to dissipate heat from heat generating components 12 which do not require component heat sink 20, as is explained later in conjunction with FIG. 5. Although not shown in FIG. 1, the video hybrid amplifiers illustrated are preferably electrically connected to circuit board 14 through the use of ninety-degree connectors mounted on circuit board 14.

Circuit board 14 is illustrated in FIG. 1 as either a broad band optical receiver card or a broad band distribution amplifier card. However, the present invention is operable with many different kinds of circuit boards. In the preferred embodiment, circuit board 14 is supported by the C-shaped cross-section 24 of removable heat transferring member 10. One end of C-shaped cross-section 24 has a recessed plane 28 designed to receive circuit board 14. When circuit board 14 is mounted on C-shaped cross-section 24, a protected environment for heat generating components 12 and the other components of circuit board 14 is formed by C-shaped interior surface 16 and circuit board 14. Circuit board 14 further includes an electrical interface 29 for coupling to a mating connector (not shown) as known in the art.

Removable heat transferring member 10 also has a rectangular end 30. A handle 32 is located near the midpoint of rectangular end 30. In addition, two member coupling holes 34, only one of which is visible in FIG. 1, are located near each end of rectangular end 30.

Figure 2:
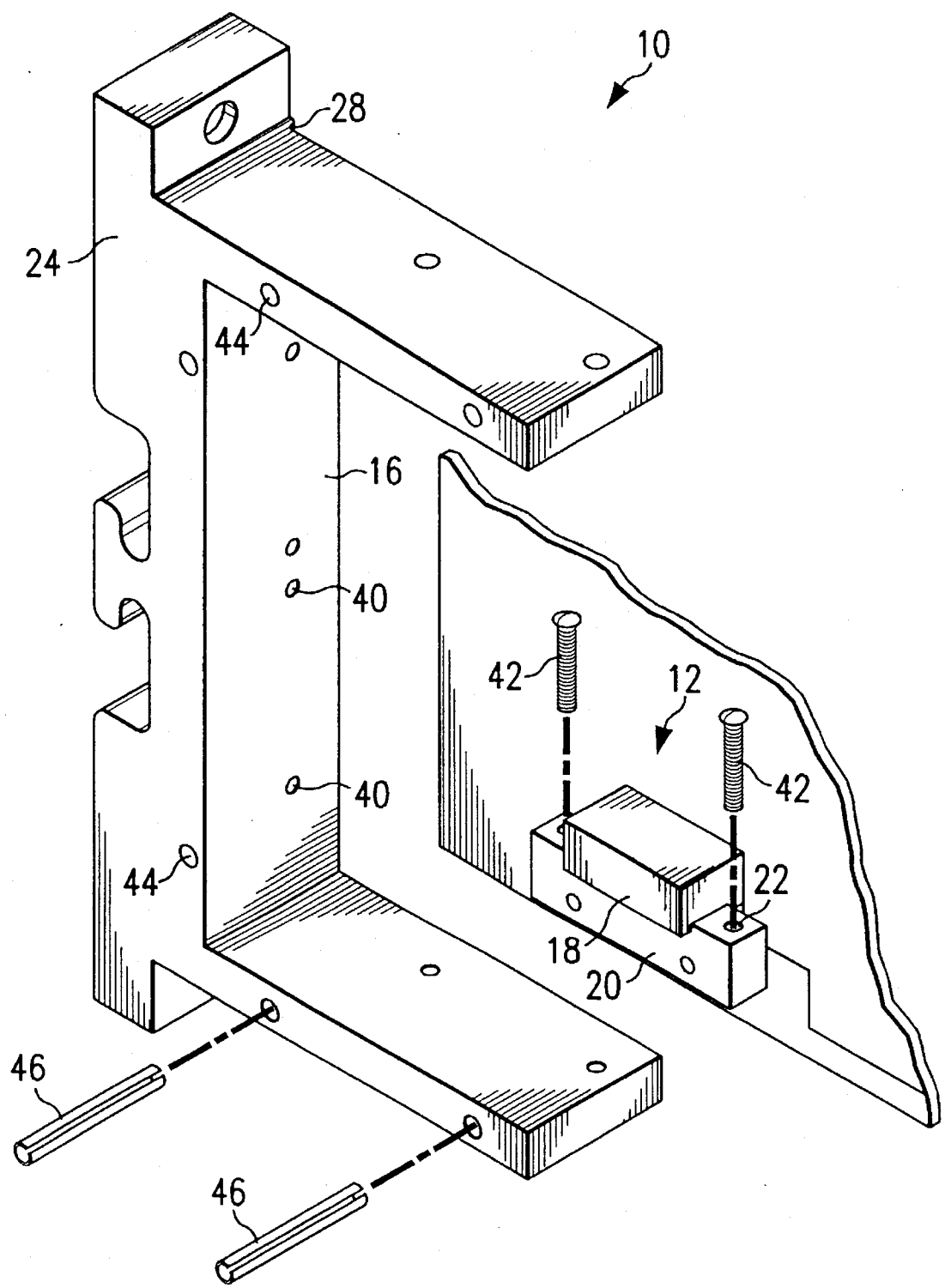
FIG. 2 is a fragmentary, partially exploded, perspective view of FIG. 1 showing the coupling of the heat generating components and circuit board to the removable heat transferring member.

FIG. 2 illustrates the preferred technique for coupling component heat sink 20 and circuit board 14 to removable heat transferring member 10. C-shaped interior surface 16 has four pairs of component coupling holes 40 spaced to correspond to component coupling holes 22 of each component heat sink 20. Each component heat sink 20 is thermally and mechanically coupled to C-shaped interior surface 16 by inserting machine screws 42 through component coupling holes 22 and into component coupling holes 40. In addition, although not shown in FIG. 2, some types of heat generating components 12 generate a large enough amount of heat so that a thermal heat transfer pad or thermal grease is preferably positioned between component heat sink 20 and C-shaped interior surface 16 to improve the thermal coupling achieved. Both thermal heat transfer pads and thermal greases are devices well known in the art.

As also shown in FIG. 2, C-shaped cross-section 24 contains six circuit board coupling holes 44. Rolling pins 46 are preferably inserted into circuit board coupling holes 44 to secure circuit board 14 to C-shaped cross-section 24 within recessed plane 28.

Figure 3:
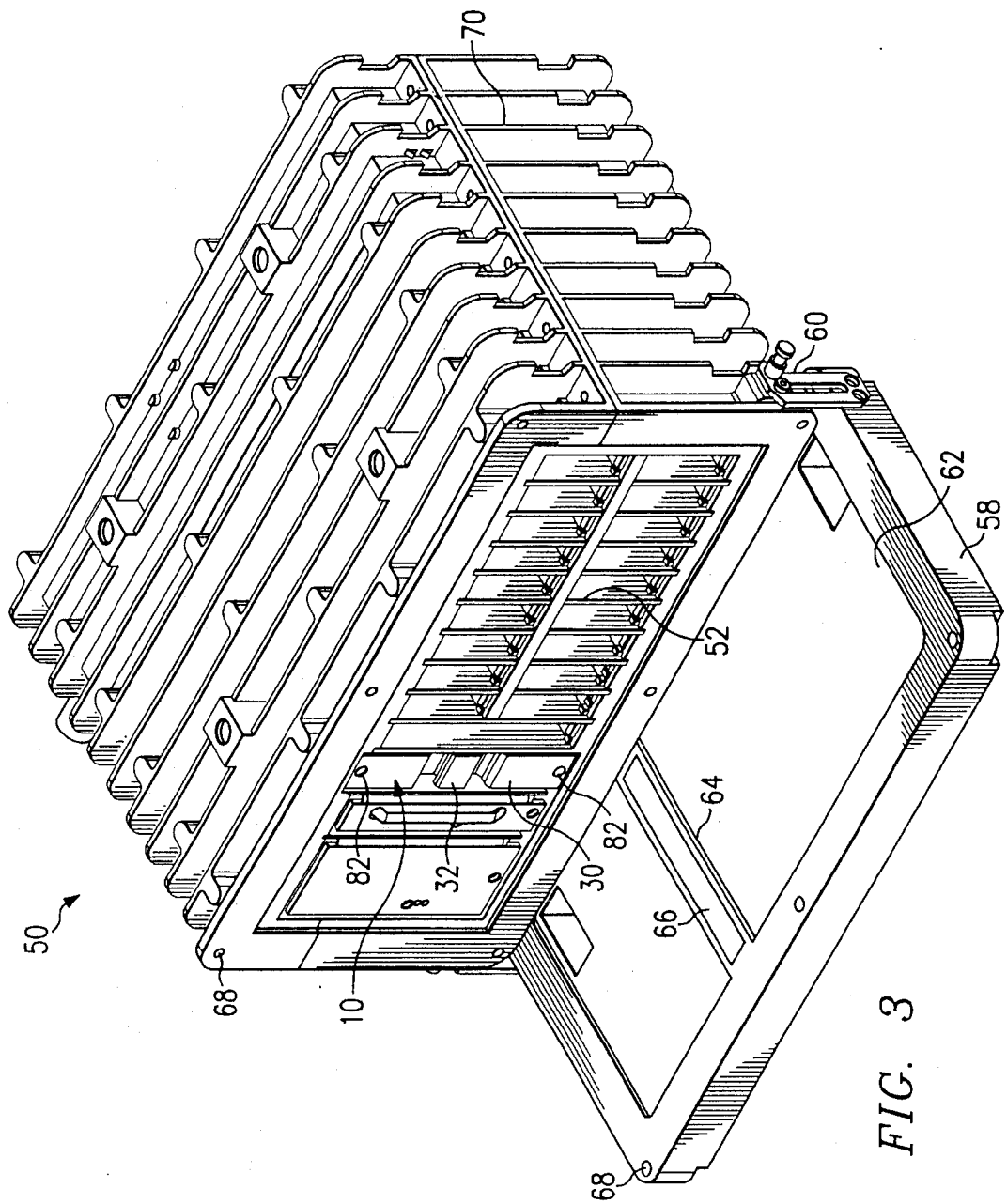
FIG. 3 is a perspective view of the removable heat transferring member of FIG. 1 inserted into the preferred housing of the present invention.

FIG. 3 illustrates an electronics housing 50 in accordance with the present invention. As shown in FIG. 3, removable heat transferring member 10 is vertically inserted within the housing interior 52 of electronics housing 50 so that rectangular end 30 is flush with the opening of housing interior 52. Although not shown in FIG. 3, electrical interface 29 of circuit board 14 typically plugs into a mating connector in the rear of housing interior 52 when removable heat transferring member 10 is inserted in this manner. In this position, member coupling holes 34 of removable heat transferring member 10 are spatially aligned with corresponding holes on electronics housing 50. As shown in FIG. 3, housing interior 52 may be designed to receive a variety of circuit boards and other electronic components other than heat generating components 12 and circuit board 14 mounted on removable heat transferring member 10. Alternatively, housing interior 52 may be designed to receive a plurality of removable heat transferring members 10.

A housing cover 58 is pivotally mounted on a cover hinge 60 located on the bottom of one end of electronics housing 50. Housing cover 58 is preferably integrally formed from a heat conductive material such as aluminum. The cover interior 62 has a heat transferring boss 64 spatially aligned in the vertical plane defined by the location where removable heat transferring member 10 is inserted into housing interior 52. A thermal heat transfer pad 66 is preferably mounted on heat transferring boss 64. Electronics housing 50 and housing cover 58 have three corresponding pairs of cover coupling holes 68 spaced around the periphery of housing interior 52. Housing exterior 70 is configured as a heat sink to generally dissipate heat from electronics housing 50.

Figure 4:
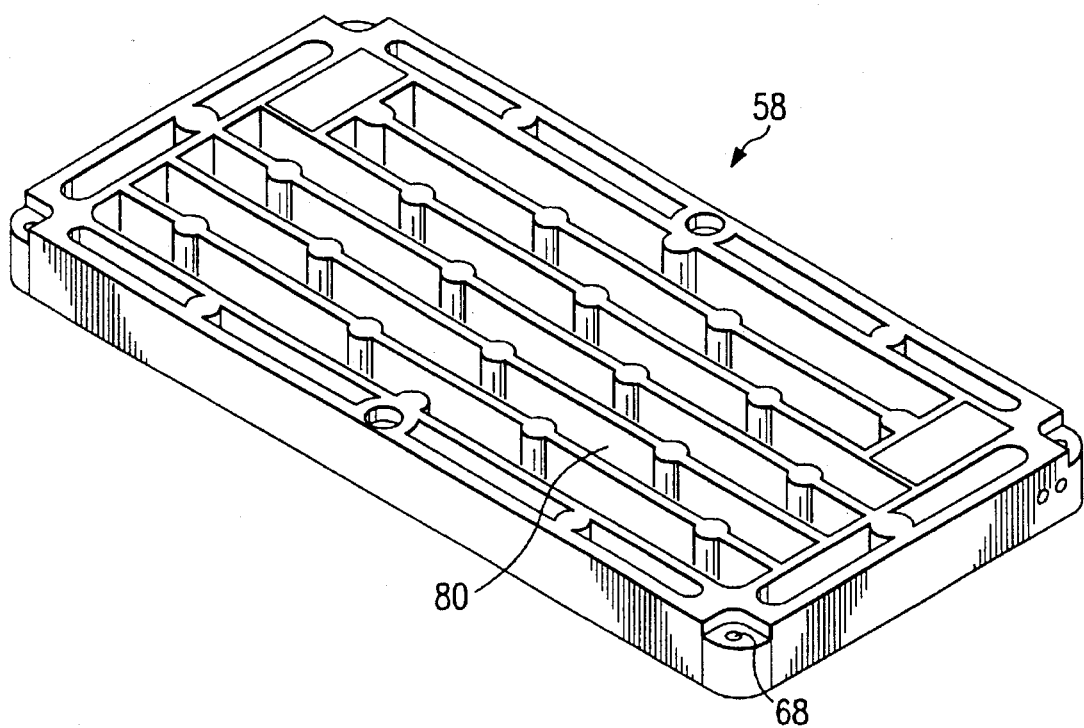
FIG. 4 is a perspective view of the preferred embodiment of the exterior side of the housing cover of the present invention.

FIG. 4 illustrates cover exterior 80 of housing cover 58. Cover exterior 80 is also preferably configured as a heat sink, and cover exterior 80 is thermally coupled with heat transferring boss 64, shown in FIG. 3. As shown in FIG. 4, cover coupling holes 68 extend completely through housing cover 58, from cover exterior 80 to cover interior 62.

The operation of the preferred embodiment of the present invention to transfer heat from heat generating components 12 to electronics housing 50 will now be discussed with reference to FIGS. 1–4. Housing cover 58 is pivoted downward about cover hinge 60 to expose housing interior 52 as shown in FIG. 3. Removable heat transferring member 10, and thus heat generating components 12 and circuit board 14, are inserted within housing interior 52 using handle 32. Removable heat transferring member 10 is initially coupled to electronics housing 50 by inserting machine screws 82 through member coupling holes 34 in removable heat transferring member 10 and into the corresponding holes in electronics housing 50. A variety of fastening mechanisms besides machine screws 82 could be utilized to perform this coupling.

Next, housing cover 58 is pivoted upward about cover hinge 60 so that housing cover 58 encloses housing interior 52. Machine screws (not shown) are inserted through cover coupling holes 68 to secure housing cover 58 over housing interior 52 of electronics housing 50. A variety of fastening mechanisms besides machine screws could be utilized to perform this coupling. In this position, thermal heat transfer pad 66, mounted on heat transferring boss 64, physically contacts rectangular end 30 of removable heat transferring member 10. Thermal heat transfer pad 66 therefore thermally couples rectangular end 30 and heat transferring boss 64 by eliminating any insulating airspace between rectangular end 30 and heat transferring boss 64.

During operation of circuit board 14, heat generating components 12 generate heat, and this heat is transferred from heat generating components 12 to each component heat sink 20. Next, each component heat sink 20 transfers heat to C-shaped interior surface 16 of removable heat transferring member 10. Because removable heat transferring member 10 is integrally formed from a heat conductive material, rectangular end 30 of removable heat transferring member 10 transfers the generated heat to heat transferring boss 64 via thermal heat transfer pad 66. Heat transferring boss 64 transfers the generated heat to cover exterior 80. Cover exterior 80, configured as a heat sink, dissipates the heat.

From the above description, one can see that removable heat transferring member 10 is removably coupled to housing 50. Cover coupling holes 68 are easily accessible when housing cover 58 encloses housing interior 52. Machine screws 82 are easily accessible when housing cover 58 is pivoted downward on cover hinge 60 to expose housing interior 52. Therefore, removable heat transferring member 10, and thus heat generating components 12 and circuit board 14, are easily removed as a single unit from electronics housing 50 for service, testing, or replacement. In addition, when removable heat transferring member 10 is reinserted into housing interior 52, the locations of member coupling holes 34 and cover coupling holes 68 allow the thermal coupling of rectangular end 30 to heat transferring boss 64 to be re-established without any subsequent operation within housing interior 52.

Figure 5:
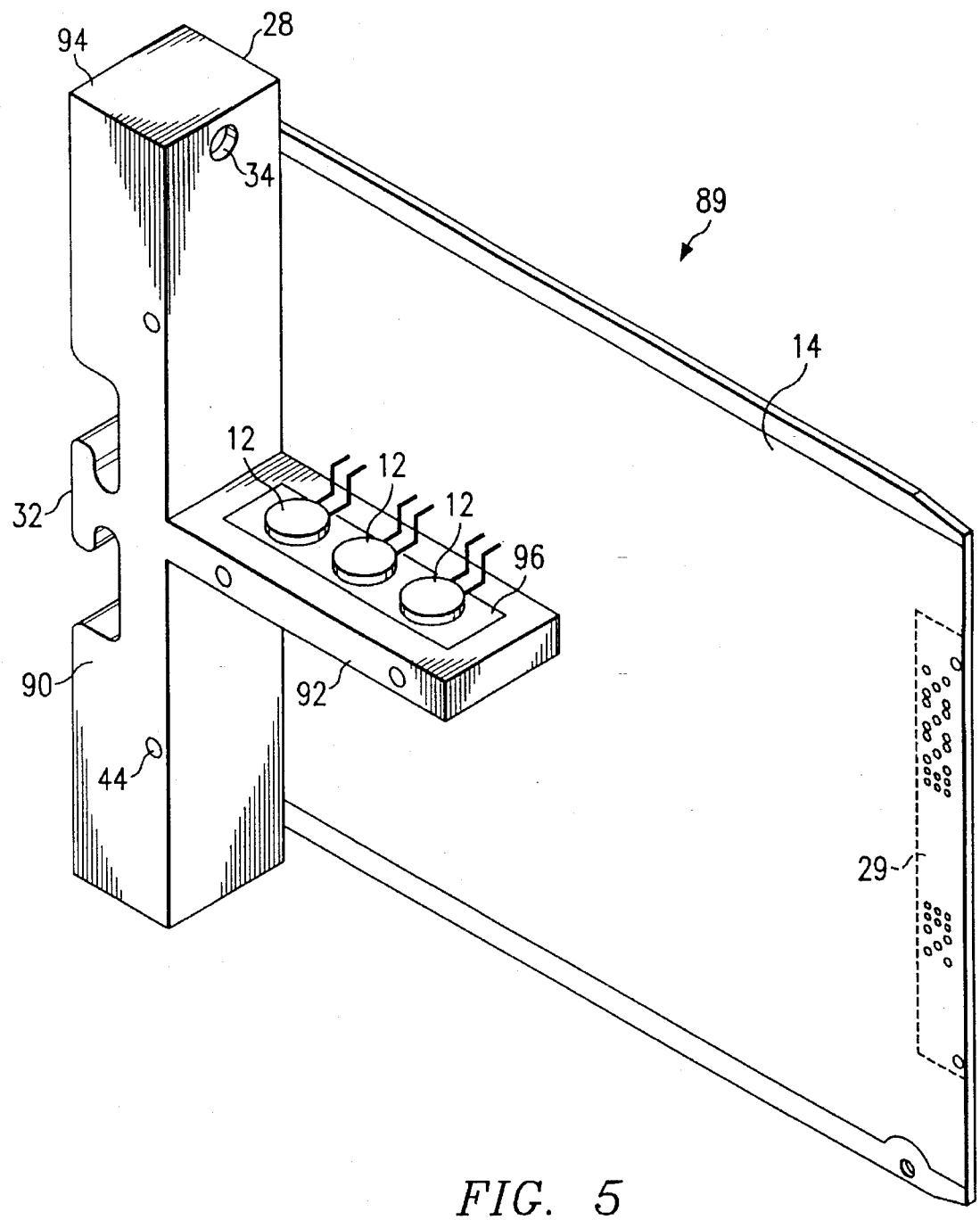
FIG. 5 is a perspective view of an alternate embodiment of FIG. 1 having a T-shaped cross-section.

FIG. 5 illustrates an alternative embodiment of removable heat transferring member 89 of the present invention having a generally T-shaped cross-section 90. Various features of FIG. 5 are the same as FIGS. 1 and 2, and therefore reference numerals from FIGS. 1 and 2 are carried forward to FIG. 5 to illustrate such features. In this alternative embodiment, removable heat transferring member 89 is composed of a component coupling member 92 and a cover coupling member 94. Component coupling member 92 and cover coupling member 94 are preferably integrally formed from a heat conductive material such as aluminum into T-shaped cross-section 90. Thermal heat transfer pad 96 is preferably mounted on component coupling member 92. Heat generating components 12, shown in FIG. 5 as capacitors, are electrically connected to circuit board 14 and thermally coupled to component coupling member 92. This thermal coupling typically occurs by lead forming heat generating components 12 so that a surface of heat generating components 12 is in direct contact with thermal heat transfer pad 96. Whether thermal heat transfer pad 96, or an amount of thermal grease, is required for adequate thermal coupling is preferably a function of the geometry, surface characteristics, and amount of heat which must be dissipated from the particular type of heat generating components 12 employed in the present invention.

Removable heat transferring member 89 cooperates with housing cover 58 to transfer heat from heat generating components 12 in a manner very similar to the preferred removable heat transferring member 10 of FIGS. 1–4. Specifically, during operation of circuit board 14, the heat generated by heat generating components 12 is transferred, in order, to thermal heat transfer pad 96, to component coupling member 92, to cover coupling member 94, to thermal heat transfer pad 66, to heat transferring boss 64, and finally to cover exterior 80. Ultimately, cover exterior 80, configured as a heat sink, dissipates the heat.

From the above, it may be appreciated that the embodiments of the present invention transfer heat from the heat generating components of a circuit board to a surrounding housing configured to dissipate the heat. The embodiments of the present invention also enable the heat generating components, a circuit board, and the supporting structure all to be easily removed from the housing for servicing, testing, or replacement in addition to accomplishing the necessary heat transfer. Consequently, while the present invention has been described in detail, various substitutions, modifications, or alterations could be made to the description set forth above without departing from the invention. For example, the removable heat transferring member of the present invention could be designed to thermally couple with the electronics housing itself instead of the cover of the electronics housing as described in the above embodiments. In addition, as long as the removable heat transferring member is capable of transferring heat from the heat generating components to a surrounding housing, a person of ordinary skill in the art may choose alternate geometries for the member, such as an L-shaped cross-section. These examples, as well as others apparent to those of ordinary skill in the art, illustrate the breadth of the invention which is defined by the following claims.

I claim:

1. An assembly for transferring heat from a heat generating component, comprising:

a heat generating component electrically connected to a circuit board;

a housing having an interior;

a cover coupled to said housing for enclosing said interior, said cover comprising an exterior side and an interior side, said interior side comprising a heat transferring surface; and a removable heat transferring member inserted into said interior of said housing, wherein said removable heat transferring member is:

thermally coupled with said heat generating component;

physically coupled with said circuit board; and thermally coupled with said heat transferring surface upon enclosing said interior with said cover, such that said cover dissipates heat transferred from said heat generating component.

2. The assembly of claim 1 wherein said exterior side of said cover comprises a heat sink apparatus.

3. The assembly of claim 1 wherein said removable heat transferring member comprises a generally C-shaped cross-section.

4. The assembly of claim 1 wherein said removable heat transferring member comprises a generally T-shaped cross-section.

5. The assembly of claim 1 wherein said removable heat transferring member comprises a handle apparatus for removing said removable heat transferring member from said housing.

6. The assembly of claim 1 and further comprising a plurality of heat generating components thermally coupled with said removable heat transferring member.

7. The assembly of claim 1 and further comprising a heat sink apparatus thermally coupled to said heat generating component, wherein said removable heat transferring member and said heat sink apparatus have a plurality of corresponding holes receiving heat transfer securing apparatus which mechanically and thermally couple said heat sink apparatus with said removable heat transferring member.

8. The assembly of claim 5 wherein said heat transferring surface comprises a boss.

9. The assembly of claim 1 wherein said removable heat transferring member comprises a recessed plane receiving said circuit board.

10. The assembly of claim 1 wherein said removable heat transferring member and said circuit board have a plurality of corresponding holes receiving securing apparatus which couple said circuit board to said removable heat transferring member.

11. The assembly of claim 1 wherein said removable heat transferring member and said housing have at least one corresponding hole receiving securing apparatus which removably couples said removable heat transferring member to said housing.

12. The assembly of claim 1 and further comprising an intermediate thermal coupler between said removable heat transferring member and said heat transferring surface.

13. The assembly of claim 12 wherein said intermediate thermal coupler comprises a thermal heat transfer pad.

14. The assembly of claim 13 and further comprising a plurality of heat generating components, wherein said removable heat transferring member comprises a first member and a second member thermally and physically coupled into a T-shaped cross-section, and wherein:

said first member thermally couples with said thermal heat transfer pad upon enclosing said interior with said cover, said second member thermally couples with said plurality of heat generating components, and said T-shaped cross-section physically couples with said circuit board.

15. The assembly of claim 13 and further comprising a plurality of heat generating components, and wherein said removable heat transferring member comprises a generally C-shaped cross-section comprising:

a C-shaped interior surface thermally coupled with said plurality of heat generating components;

a closed, generally rectangular end thermally coupled with said thermal heat transfer pad upon enclosing said interior with said cover; and a cross-sectional surface physically coupled with said circuit board.

16. The assembly of claim 15 wherein said C-shaped cross-section of said removable heat transferring member is integrally formed.

17. The assembly of claim 15 and further comprising a plurality of first heat sink apparatus thermally coupled to respective ones of said plurality of heat generating components, wherein said C-shaped interior surface and respective ones of said plurality of first heat sink apparatus have a plurality of corresponding holes receiving heat transfer securing apparatus which mechanically and thermally couple said plurality of first heat sink apparatus with said C-shaped interior surface;

wherein said closed, generally rectangular end comprises a handle apparatus for removing said removable heat transferring member from said housing;

wherein said heat transferring surface comprises a boss; and wherein said exterior side of said cover comprises a second heat sink apparatus.

* * * * *